United States Patent
Goergen et al.

(10) Patent No.: US 7,897,880 B1
(45) Date of Patent: Mar. 1, 2011

(54) INDUCTANCE-TUNED CIRCUIT BOARD VIA CROSSTALK STRUCTURES

(75) Inventors: Joel R. Goergen, Maple Grove, MN (US); Greg Hunt, San Jose, CA (US); Peter Tomaszewski, San Jose, CA (US); Joseph Pankow, Sunnyvale, CA (US); Michael Laudon, San Jose, CA (US)

(73) Assignee: Force 10 Networks, Inc, San Jose, CA (US)

( * ) Notice: Subject to any disclaimer, the term of this patent is extended or adjusted under 35 U.S.C. 154(b) by 555 days.

(21) Appl. No.: 11/999,796

(22) Filed: Dec. 7, 2007

(51) Int. Cl.
*H05K 1/11* (2006.01)

(52) U.S. Cl. ......... 174/262; 174/261; 174/265; 361/780; 361/794; 361/795

(58) Field of Classification Search .......... 174/260–267, 174/250, 255, 257, 33; 361/780, 794, 795, 361/799, 800, 760, 792
See application file for complete search history.

(56) References Cited

U.S. PATENT DOCUMENTS

| | | | | |
|---|---|---|---|---|
| 6,778,043 | B2 * | 8/2004 | Stoddard et al. | 333/246 |
| 7,235,989 | B2 * | 6/2007 | Li et al. | 324/754 |
| 7,239,526 | B1 * | 7/2007 | Bibee | 361/788 |
| 7,583,513 | B2 * | 9/2009 | Boggs et al. | 361/792 |
| 7,687,391 | B2 * | 3/2010 | Harvey et al. | 438/622 |
| 2007/0289773 | A1 * | 12/2007 | Caletka et al. | 174/262 |
| 2008/0121421 | A1 * | 5/2008 | Kashiwakura | 174/262 |

* cited by examiner

*Primary Examiner* — Dameon E Levi
*Assistant Examiner* — Hoa C Nguyen
(74) *Attorney, Agent, or Firm* — Robert C. Schuler

(57) ABSTRACT

Plated through holes pass through clearances in a ground plane of a circuit board. A conductive collar/spoke arrangement is constructed on the ground plane adjacent the clearance, to provide an inductive component to the coupling between a plated through hole and the ground plane. The inductive component impedes the transfer of high-frequency noise between the through hole and the ground plane. Other embodiments are also described and claimed.

29 Claims, 14 Drawing Sheets

INDUCTANCE-TUNED CIRCUIT BOARD VIA CROSSTALK STRUCTURES

BACKGROUND

1. Field of the Invention

The present disclosure relates generally to circuit board signal/ground plane structures, and more particularly to impedance-tuning of a signal/ground plane structure.

2. Description of Related Art

Electronic assemblies commonly employ one or more printed circuit boards in their construction. Such circuit boards provide mounting points for electronic components and/or for sockets that allow other circuit boards, cables, or device packages to connect to the circuit board. The circuit board provides conductive traces, and possibly planar conductive regions, patterned on conductive layers sandwiched between insulating dielectric layers. A typical circuit board may contain anywhere from a few conductive layers to upwards of thirty such layers for complex systems. Conductive traces route signals (and possibly power) from one point on the circuit board to another point on the circuit board. Planar conductive regions are employed for power distribution. Planar conductive regions also serve as reference planes, which when coupled through a dielectric layer to one of the conductive traces or a differential pair of such traces, form stripline transmission lines of specific impedance. Plated through-holes (PTHs) in the circuit board can form mounting points for press-fit devices, allow for signal insertion/extraction to the internal board layers, and can also serve as layer-swapping vias that transfer a signal from a trace on one conductive layer to another trace on another conductive layer.

FIG. 1 contains a perspective view of a partial circuit board assembly 100, with the intervening dielectric layers removed for visibility. Assembly 100 includes end sections of two differential trace pairs (D1+, D1−; D2+; D2−) on two signal layers, two digital ground reference planes G1 and G2 on two plane layers, and two PTHs T1+, T1−. Differential trace D1+ connects to PTH T1+ at a pad P1+, and differential trace D1− connects to PTH T1− at a pad P1−. Differential trace D2+ connects to PTH T1+ at a pad P2+, and differential trace D2− connects to PTH T1− at a pad P2−. Accordingly, PTHs T1+, T1− provide electrical continuity to transfer a differential signal from differential trace pair D1+, D1− to differential trace pair D2+, D2−. Other PTHs may transfer similar signals directly from a component mounted over or near a PTH, or a component or connector having a pin inserted into the PTH, to a conductive trace on an interior circuit board trace layer.

Each PTH extends through one or more reference planes to connect two signal layers or one signal layer to the circuit board surface components/layer. PTHs T1+ and T1− both extend through ground planes G1 and G2. At the location where a signal PTH will be fabricated, a clearance is formed in each plane layer so that the PTH will not short to the plane layer. In FIG. 1, PTH T1+ passes through a clearance C1+ on G1 and a clearance C2+ on G2; PTH T1− passes through similar clearances C1−, C2− on G1 and G2, respectively.

With some PTHs, the capacitance between the through hole and a reference plane that the through hole passes through is adjusted in one or both of two ways. The first way is to vary the size of the clearance. The amount of capacitance variation available by this method is, however, limited by the minimum clearance size that must be maintained between the PTH and the ground plane to prevent shorts. To add additional capacitance, a nonfunctional pad is formed on the reference layer, centered in the clearance, and the PTH is drilled through and then electrically connected to the dead pad, such as is shown for dead pads DP+ and DP−, in clearances C1+ and C1−, respectively. One of the inventors of the present invention has previously patented the use of such nonfunctional pads on selected ground plane layers to tailor the impedance of a through hole, see, e.g., U.S. Pat. No. 6,812,803.

BRIEF DESCRIPTION OF THE DRAWINGS

The present invention can be best understood by reading the specification with reference to the following Figures, in which.

DETAILED DESCRIPTION

Figure 1:
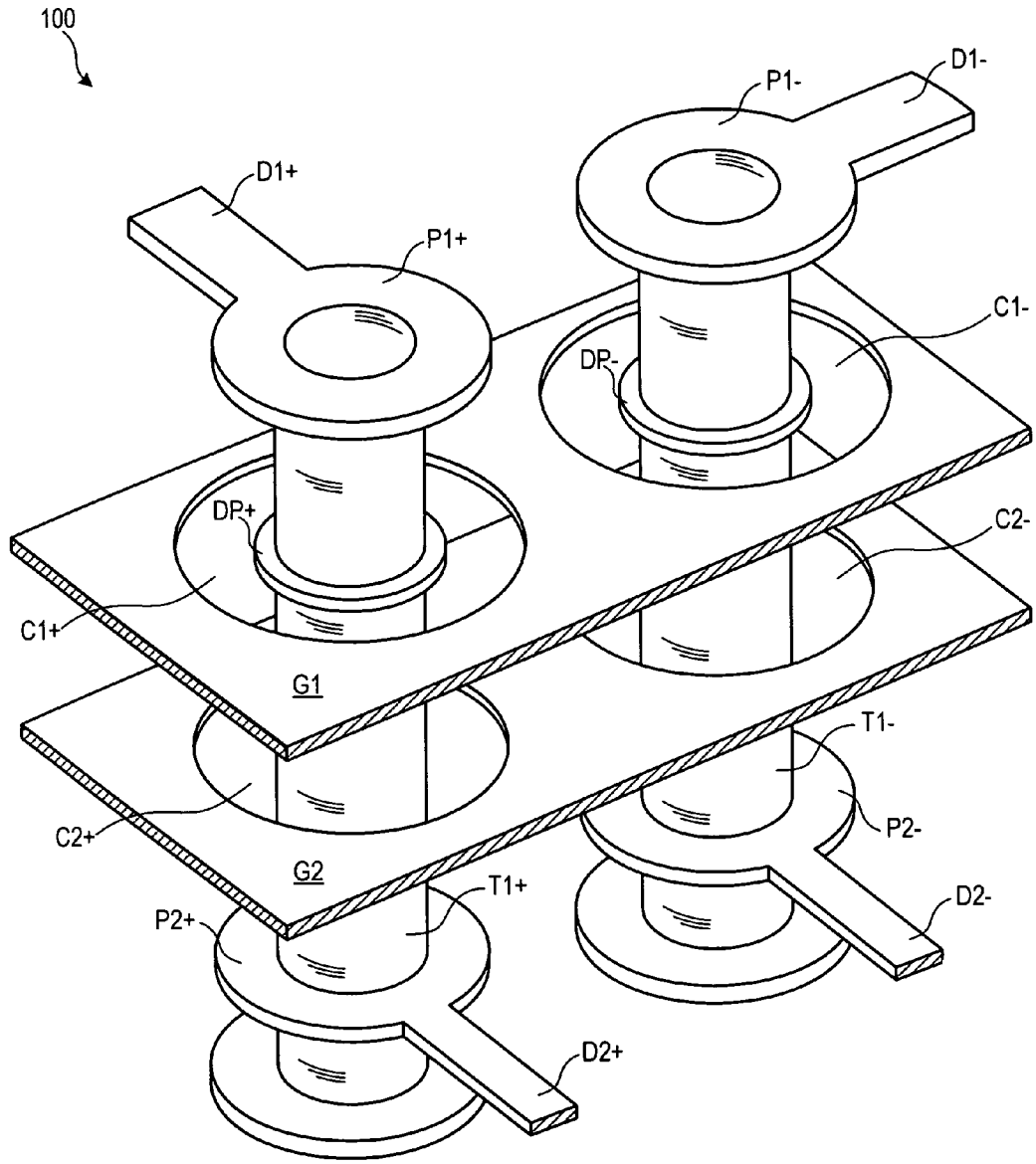
FIG. 1 contains a perspective view of a prior art partial circuit board assembly.
Figure 2:
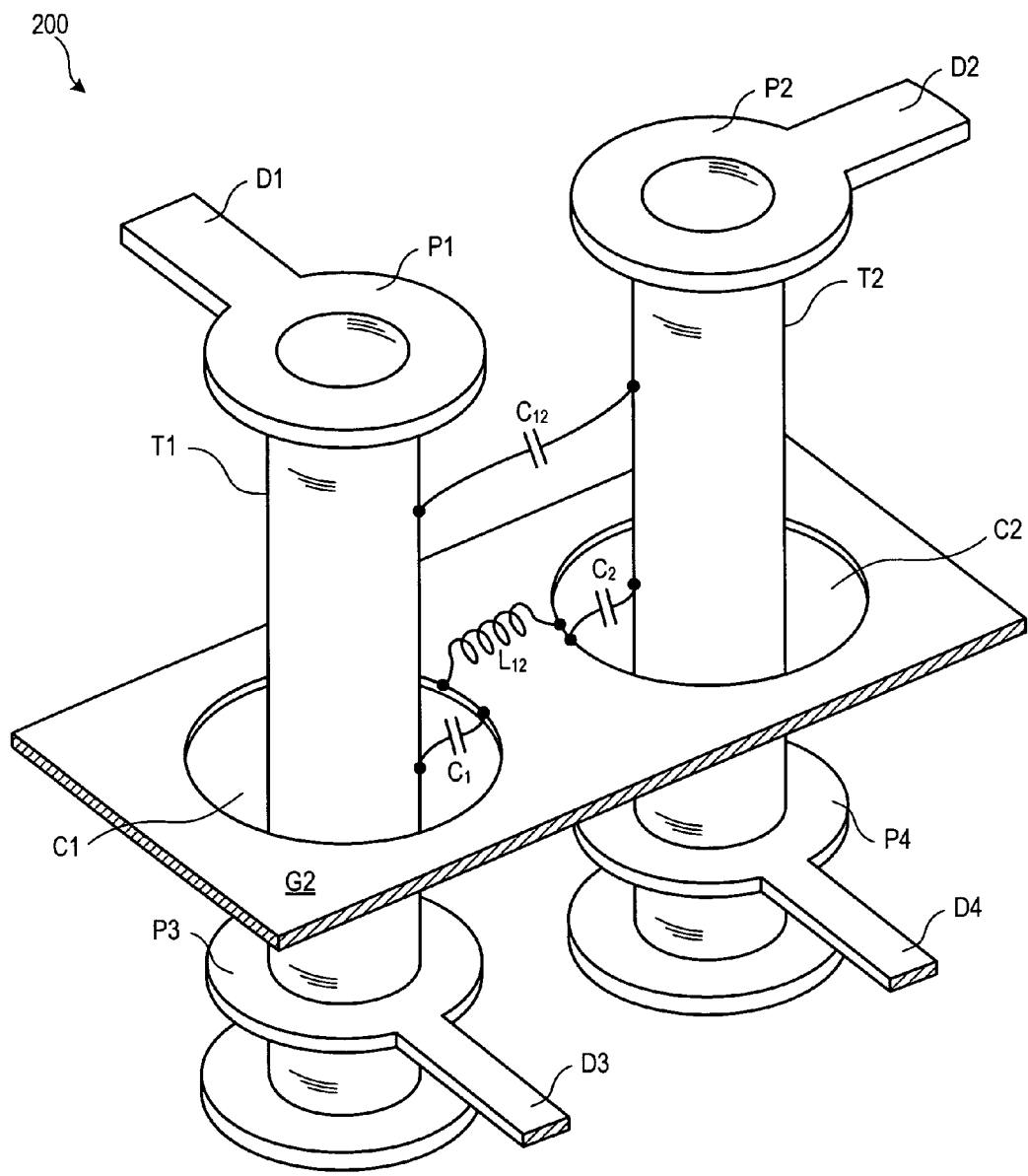
FIG. 2 contains a perspective view of a partial circuit board assembly, overlaid with some circuit modeling elements.

When two PTHs are located next to each other, signals can couple from one PTH to its neighbor through several paths. FIG. 2 shows a partial circuit board assembly 200 including two PTHs, T1 and T2, passing through clearances C1 and C2, respectively, in a ground plane G2. Signals or noise on each PTH can capacitively couple to the other PTH directly through the dielectric material, with this coupling represented in FIG. 2 by capacitance $C_{12}$. Signals or noise on T1 also couples to G2 through a capacitance $C_1$, and signals or noise on T2 couples to G2 through a capacitance $C_2$. Thus signals on either PTH also can couple to the neighboring PTH through capacitances $C_1$ and $C_2$ and ground plane G2, limited by the inductance $L_{12}$ of the ground plane and distance between the clearances (the coupled signals/noise radiate through the ground plane such that the coupling becomes much less significant for PTHs located far from the source PTH). Because $C_{12}$ is generally much smaller than the series capacitance through $C_1$ and $C_2$ (on this and other ground planes, not shown), coupling between two PTHs through the intermediate ground plane(s) is a significant source of crosstalk. The impedance $Z_{12}$ between T1 and T2 through ground plane G2 can be modeled as $$Z_{12}=1/j\omega C_1+j\omega L_{12}+1/j\omega C_2$$

Because the inductance $L_{12}$ is negligible in this configuration, even at frequencies much greater than 1 GHz, high-frequency signals/noise can couple quite effectively between neighboring PTHs.

It is generally not desirable to increase the size of the clearances to reduce capacitance and crosstalk between neighboring PTHs. First, capacitive coupling between a PTH and the ground plane is desirable to better match the impedance of the PTH to the impedance of the stripline conductor(s) connected to the PTH, which also couple to the ground plane. This increases the efficiency of signal transmission and reduces reflections. Second, for differential pairs, the differential coupling between the PTHs of a differential pair should be maintained, if possible, close to that of the differential striplines coupled to the differential pair PTHs, and in many cases this is also a factor in the selection of the clearance size. Third, increasing the size of clearances allows more noise to propagate out of a space between neighboring ground planes into neighboring spaces. Fourth, increasing the size of clearances reduces the routing space available on signal layers to route stripline over a ground plane.

In the prior art, no attempt was made to add an inductive component to the coupling between a PTH and a ground plane. It has now been discovered that an inductive component can be added and controlled using, instead of a simple clearance, a conductive collar/spoke arrangement around a PTH. A variety of possible conductive collar/spoke arrangements are presented herein, including those that attenuate the transmission of high-frequency noise from the ground plane to the collar (and therefore to the PTH), and those that accomplish this while presenting a lower-inductance path between two PTHs that are part of a differential pair. By incorporating such features in one or more ground planes of a circuit board, the circuit board can be made to damp the coupling of undesirable high-frequency signals/noise from the ground plane to a PTH, while maintaining an effective ground reference to the PTH/differential pair.

Figure 3:
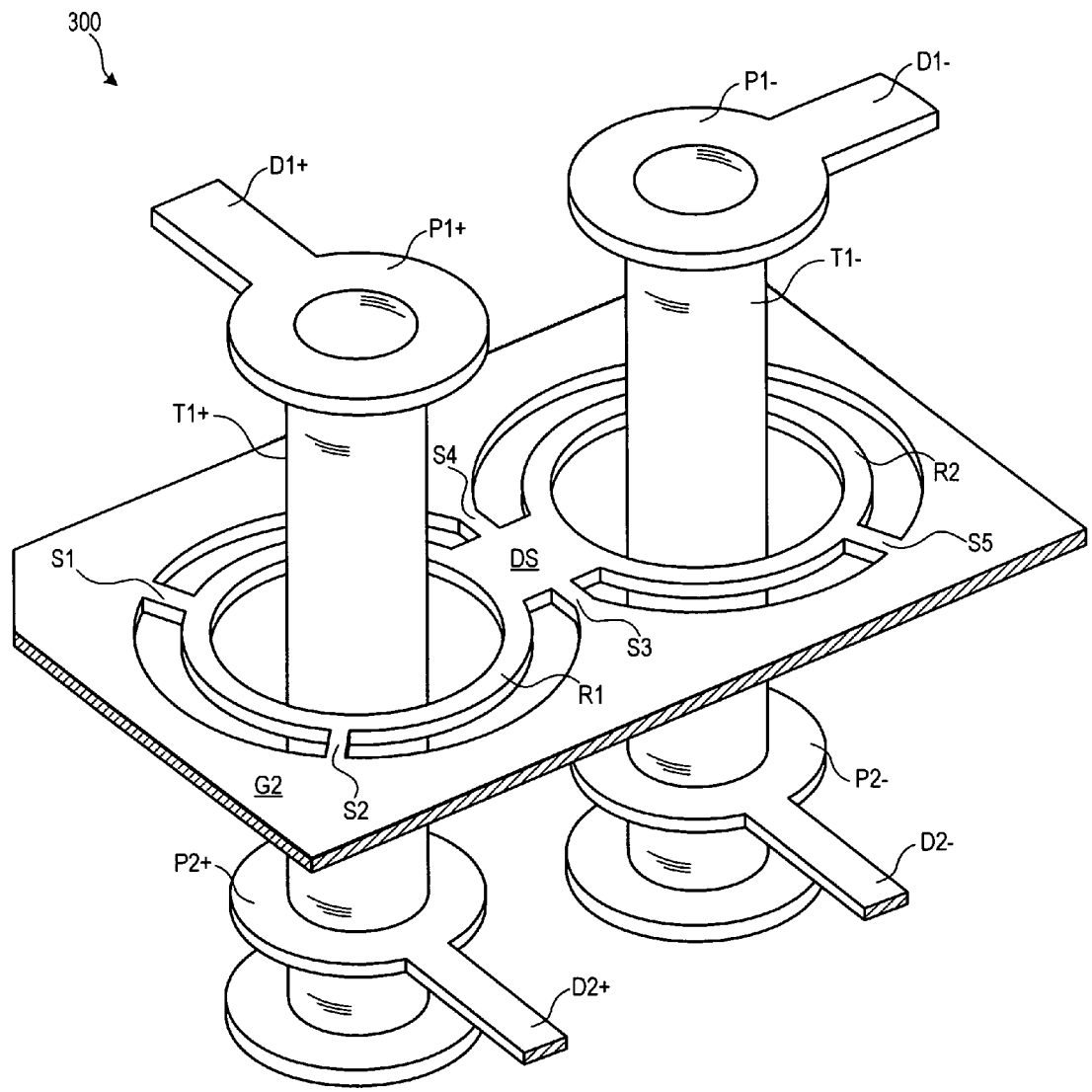
FIG. 3 shows a perspective view of a partial circuit board assembly including ground plane layer features according to an embodiment.

FIG. 3 illustrates, in perspective view, a partial circuit board assembly 300 according to a first embodiment. Partial circuit board assembly 300 includes a first differential pair, D1+, D1−, connected respectively to a second differential pair, D2+, D2−, through a path comprising a first pair of pads P1+, P1−, a pair of PTHs T1+, T1−, and a second pair of pads P2+, P2−. PTHs T1+, T1− pass through a ground plane G2 that lies intermediate the signal layers containing the two sets of differential pairs and pads.

A collar/spoke arrangement provides the ground plane coupling from PTHs T1+, T1− to the adjacent portions of ground plane G2. The collar/spoke arrangement comprises a conductive ring R1 around T1+, separated by a clearance, a conductive ring R2 around T1−, separated by a clearance, a thick differential spoke DS in the region between the two PTHs, and six smaller spokes (S1, S2, S3, S4, S5, and a sixth spoke from R2 to G2, the sixth spoke occluded in FIG. 3 by T1−). Spoke DS connects rings R1 and R2. Spokes S1 and S2 are spaced around ring R1 from spoke DS, and connect ring R1 to adjacent portions of plane G2. Spoke S5 and the occluded spoke are spaced around ring R2 from spoke DS, and connect ring R2 to adjacent portions of plane G2. Spokes S3 and S4 connect differential spoke DS to adjacent portions of plane G2. Rings R1 and R2 and differential spoke DS provide differential coupling between the two PTHs, with low inductance. The six smaller spokes, however, inductively limit the coupling of high-frequency noise from adjacent portions of G2 to the two PTHs.

Figure 4:
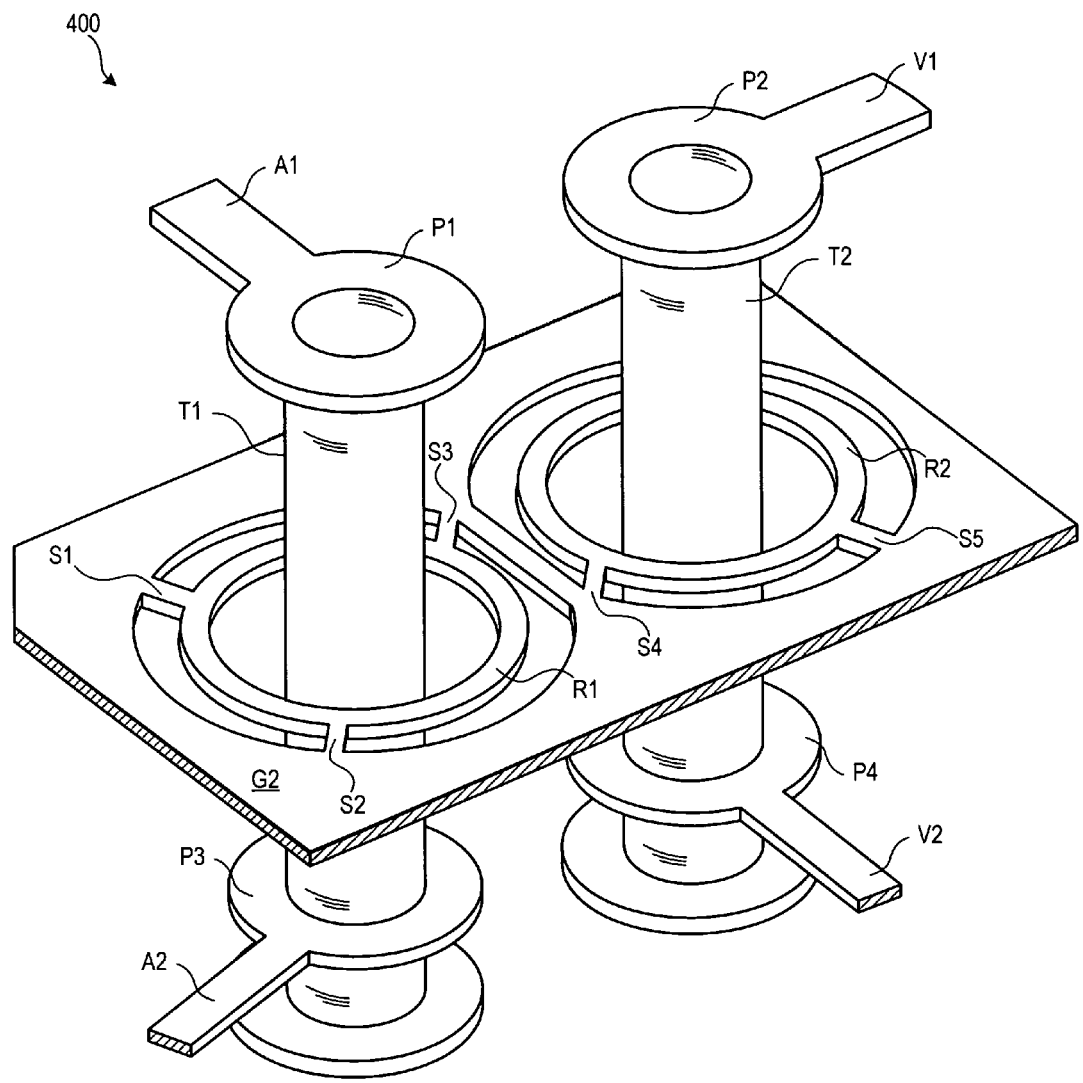
FIG. 4 shows a perspective view of a partial circuit board assembly including ground plane layer features according to another embodiment.

FIG. 4 illustrates, in perspective view, a partial circuit board assembly 400 according to a second embodiment. Partial circuit board assembly 400 includes an aggressor signal path from a stripline conductor A1 on one signal layer to another stripline conductor A2 on another signal layer, and a victim signal path from a stripline conductor V1 on one signal layer to another stripline conductor V2 on another signal layer (the signal layers used for both signal paths are shown the same, but this is not necessary to the embodiment). The aggressor signal path comprises stripline conductor A1 connected to a pad P1, connected in turn to a PTH T1, connected in turn to a pad P3, and connected in turn to a stripline conductor A2. The victim signal path comprises stripline conductor V1 connected to a pad P2, connected in turn to a PTH T2, connected in turn to a pad P4, and connected in turn to a stripline conductor V2. Signals on the aggressor signal path can couple as noise to the victim signal path due to coupling through the PTHs and ground plane G2 (the reverse is true as well). A collar/spoke arrangement provides the ground plane coupling from PTHs T1, T2 to the adjacent portions of ground plane G2. The collar/spoke arrangement comprises a conductive ring R1 around T1, separated by a clearance, a conductive ring R2 around T2, separated by a clearance, and six spokes (S1, S2, S3, S4, S5, and a sixth spoke from R2 to G2, the sixth spoke occluded in FIG. 4 by T2). Spokes S1, S2, S5, and the occluded spoke are identical to the like-named spokes of FIG. 3. Spokes S3 and S4, however, are offset from each other to reduce coupling from T1 to T2 through the ground plane. Spokes S3 and S4 are shifted respectively around rings R1 and R2, such that no spoke is aligned in the region between the two PTHs and a relatively long inductive path exists between the two PTHs. This lengthy path is aided by reducing the connecting portion of G2 between the two clearances to a thin member as well, which adds additional inductance to any coupling between the two PTHs.

Figure 5:
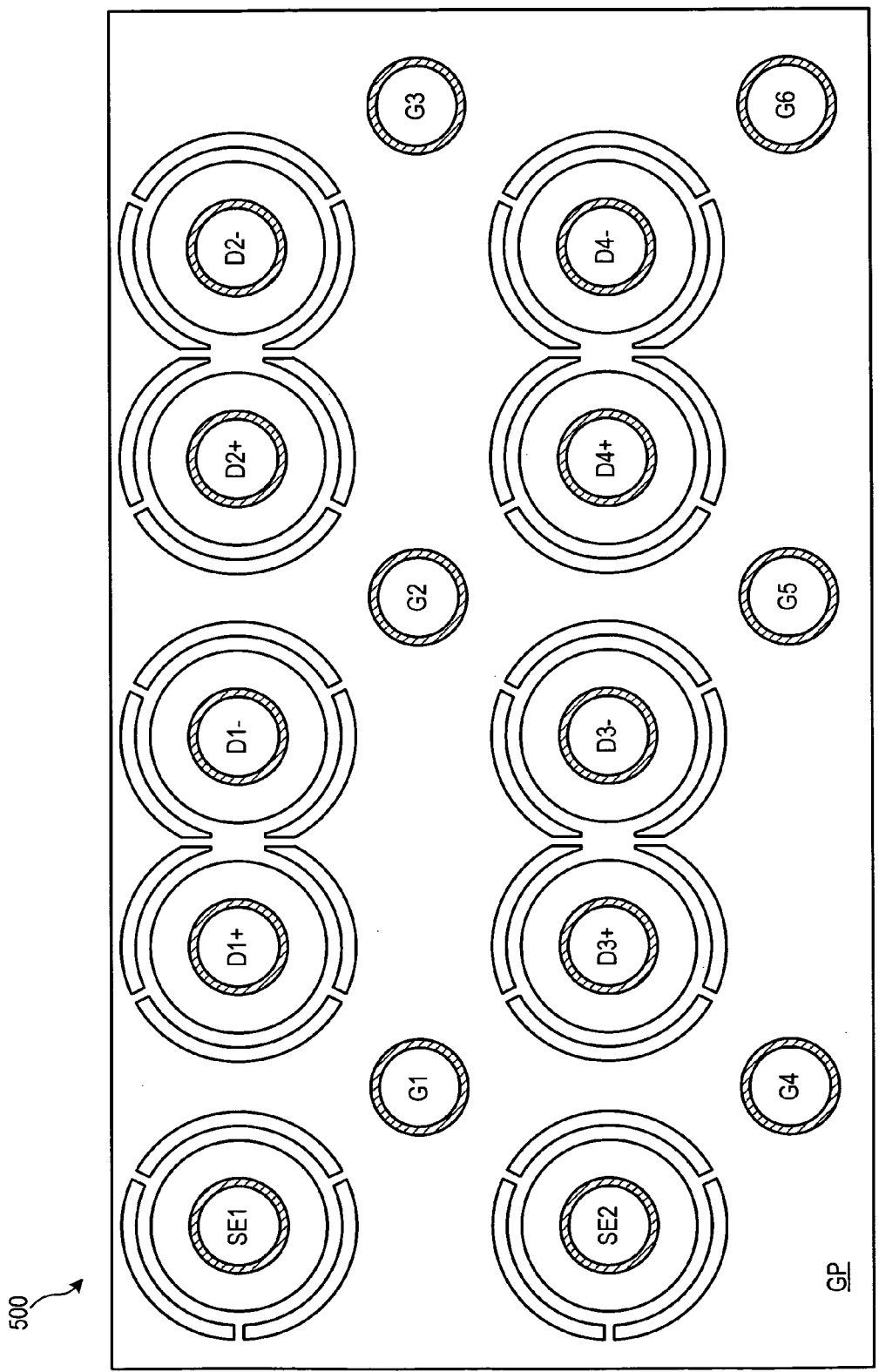
FIG. 5 illustrates in plan view a ground plane layer in a connector region, according to an embodiment.

In many circuit boards, through holes are concentrated in areas where a connector or integrated circuit connects to the board. For instance, FIG. 5 shows atop view of a horizontal cross-section 500 through a connector region of a circuit board. The portion of the connector region shown in cross-section 500 includes a patterned ground plane GP and 16 PTHs. The 16 PTHs serve two single-ended signals SE1, SE2, four differential pairs (D1+, D1−) (D2+, D2−), (D3+, D3−), and (D4+, D4−), and six ground-plane coupling PTHs G1-G6. Each differential pair capacitively/inductively couples to GP through a collar/spoke arrangement similar to that shown in FIG. 3. The spokes of each collar are either placed in the region between two differential PTHs, or spaced so as to be directed at a nearby ground-plane coupling PTH instead of a neighboring signal PTH that is not part of the same differential pair. The single-ended PTHs SE1 and SE2 use a similar collar/spoke structure, with three spokes that couple with GP in the direction of a nearby ground-plane coupling PTH, or are directed away from other signal PTHs.

Figure 6:
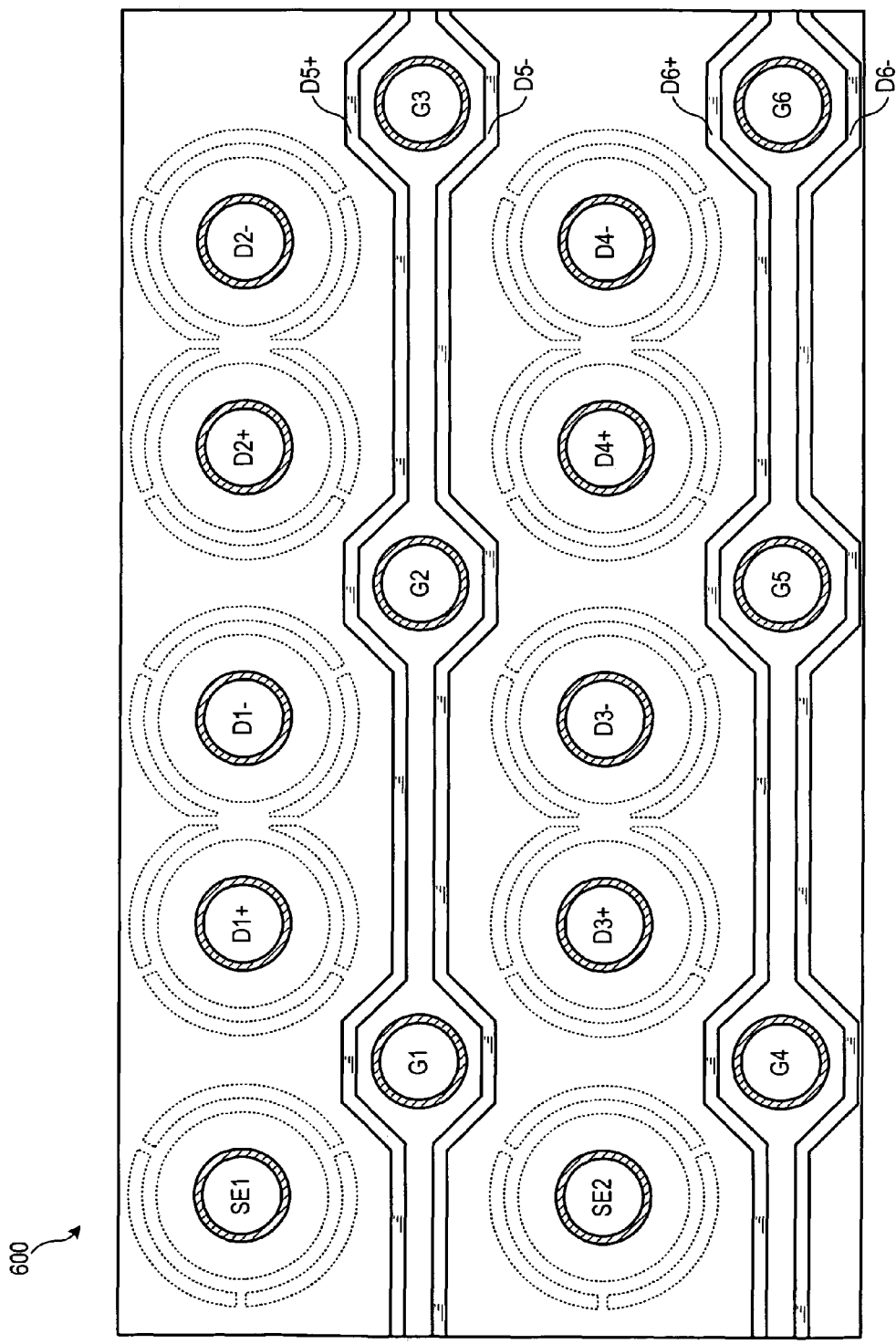
FIGS. 6 and 7 illustrate differential pair routing channels for a signal layer adjacent the ground plane layer of FIG. 5.

FIG. 6 shows a top view of a horizontal cross-section 600 through the same connector region as FIG. 5, but cut so as to show a signal layer overlying the ground plane layer of FIG. 5. The same 16 PTHs are shown, with the features of the underlying ground plane shown in hidden lines. Two differential pairs route through the connector region on the signal layer shown—a differential pair (D5+, D5−) and a differential pair (D6+, D6−). Both differential pairs route from left to right through the connector region, centered on a row of ground-plane coupling PTHs. The differential pairs route over solid portions of the ground plane and not over the ring/spoke structures surrounding the signal PTHs.

Figure 7:
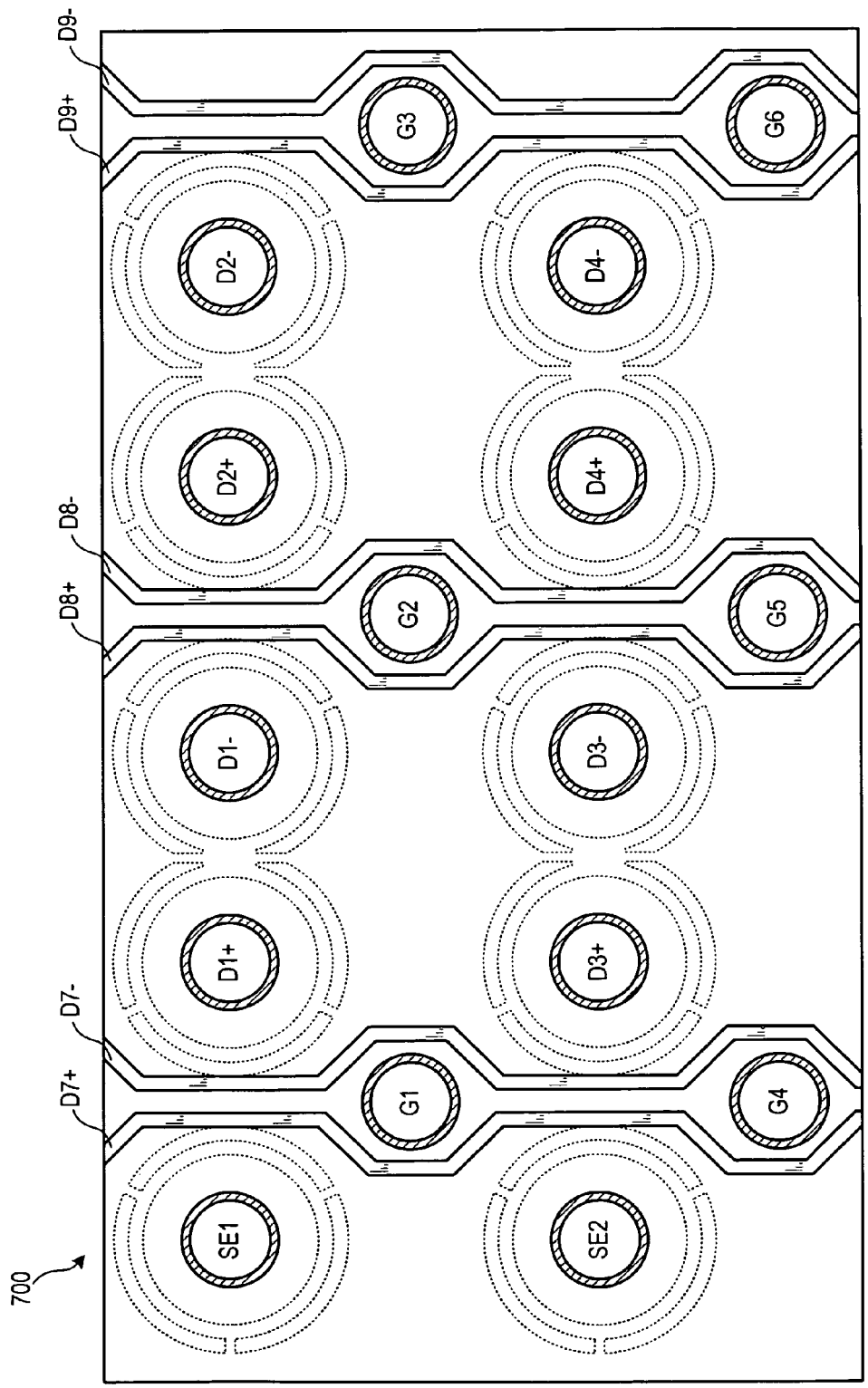

FIG. 7 shows a top view of a horizontal cross-section 700 through the same connector region as FIG. 5, but cut so as to show a signal layer overlying the ground plane layer of FIG. 5. The signal layer of FIG. 7 presents an alternate arrangement to that shown in FIG. 6, with three differential pairs that route through the connector region on the signal layer shown—a differential pair (D7+, D7−), a differential pair (D8+, D8−), and a differential pair (D9+, D9−). All three differential pairs route from top to bottom through the connector region, centered on a column of ground-plane coupling PTHs. The differential pairs route over solid portions of the ground plane and not over the ring/spoke structures surrounding the signal PTHs, in the regions between neighboring differential pairs or between a differential pair and a single-ended neighbor.

FIGS. 6 and 7 show some exemplary routing paths possible with the collar/spoke arrangement. A given routing design can use both vertical and horizontal paths through portions of the same region, and/or signal traces that combine both vertical and horizontal paths.

Figure 8:
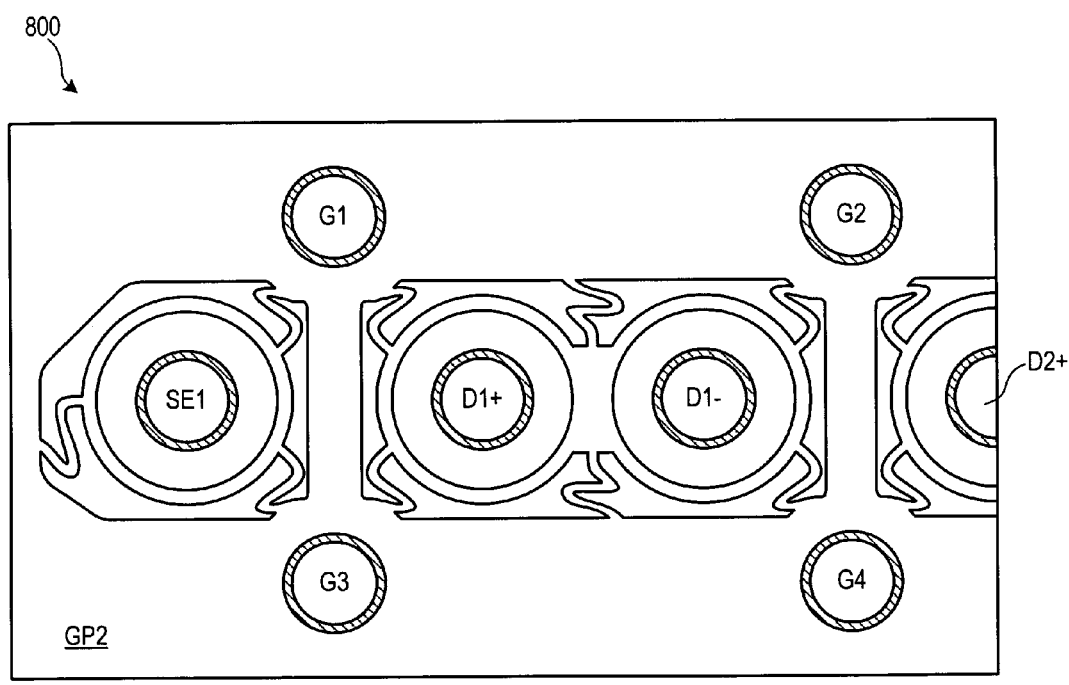
FIG. 8 illustrates in plan view a ground plane layer in a connector region, according to another embodiment.

FIG. 8 shows a top view of a smaller horizontal cross-section 800 through a connector region of a circuit board. The portion of the connector region shown in cross-section 800 includes a patterned ground plane GP2 and 8 PTHs (representing, for instance, a smaller portion of the same PTH pattern shown in FIGS. 5-7). The 8 PTHs serve a single-ended signal SE1, a differential pair (D1+, D1−) and one half of a differential pair (D2+, D2− (not shown)), and four ground-plane coupling PTHs G1-G4. In contrast to the FIG. 5 embodiment, a different collar/spoke arrangement is provided. Instead of the opening between each collar and the adjacent portions of the ground plane following the contour of the collar, as before, the openings widen in the areas where a spoke is to join a collar (or central differential spoke in the case of D1+, D1−) to the adjacent ground plane. This allows for longer spokes with increased inductance. Further, as shown, the spokes in such a design can take a more circuitous route to join the collar to the adjacent ground plane, further increasing inductance. The openings in FIG. 8 also reduce the capacitive coupling between the rings and the adjacent ground plane areas, which further improves high-frequency noise rejection.

Figure 9:
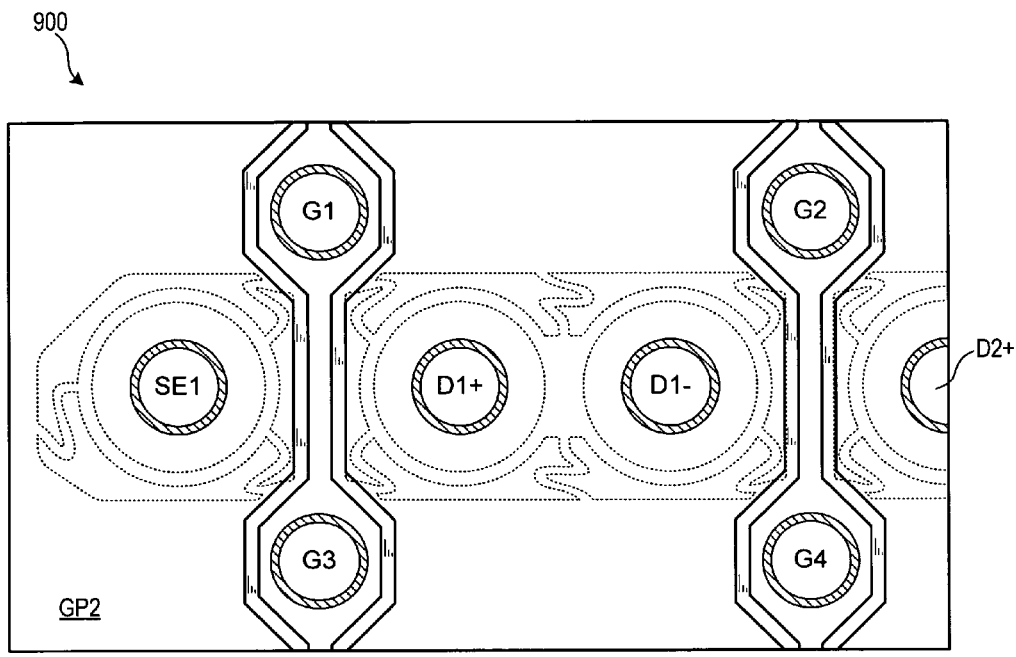
FIGS. 9 and 10 illustrate differential pair routing channels for a signal layer adjacent the ground plane layer of FIG. 8.
Figure 10:
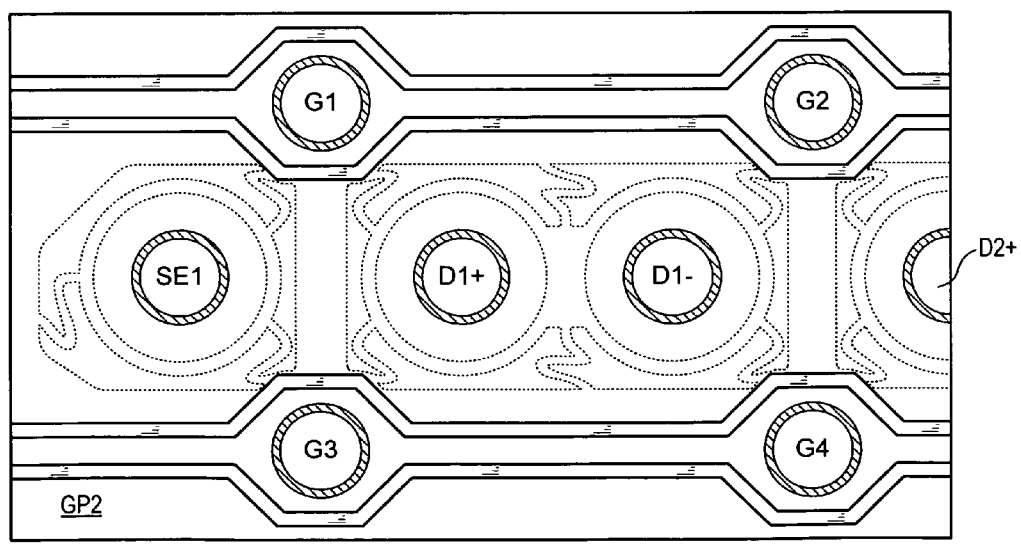

Like the FIG. 5 embodiment, the FIG. 8 embodiment leaves top-to-bottom and left-to-right routing channels for routing conductors through the connector region. FIG. 9 and FIG. 10 contain cross-sections 900 and 1000, respectively, showing exemplary routing of differential pairs top-to-bottom and left-to-right in a signal plane overlying ground plane GP2.

Figure 11C:
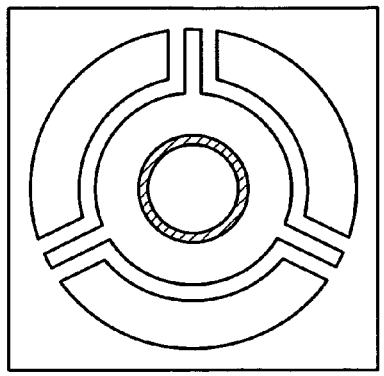
FIGS. 11A-F illustrate, in plan view, exemplary embodiments for conductor collars.
Figure 11F:
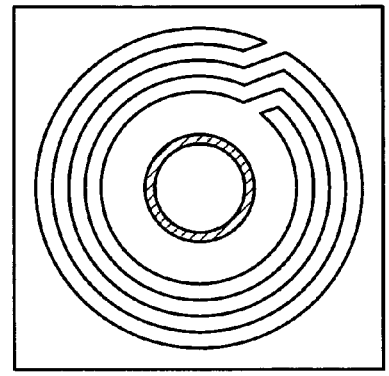

A wide variety of other collar/spoke designs are possible, depending on the desired effect. A PTH passing through and surrounded by a looped collar will induce some current in the loop. In FIG. 11A, the collar comprises a ring that does not close on itself, and terminates at each end at a spoke. Any current induced in the collar by the PTH or vice-versa passes through the entire spoke/ring/spoke assembly, which will tend to discourage high frequency interference between the ground plane and the PTH.

Figure 11B:
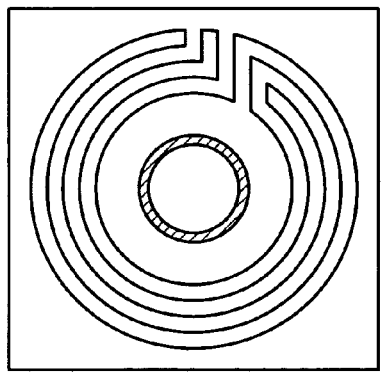

In FIG. 11B, the collar comprises two concentric loops around the PTH. The loops are connected, however, so that any current circulating through the loops circulates clockwise in one loop and then counterclockwise in the other loop, thereby producing a different inductive coupling effect than the FIG. 11A embodiment.

FIG. 11C is similar to FIG. 11A, except the single-looped collar is broken into three identical segments, each connected at both ends to the ground plane by two spokes. It is believed that the inductance of the FIG. 11C embodiment is less than that of the FIG. 11A embodiment, but more than the single-ended spoke embodiment of the FIG. 5 embodiment.

Figure 11E:
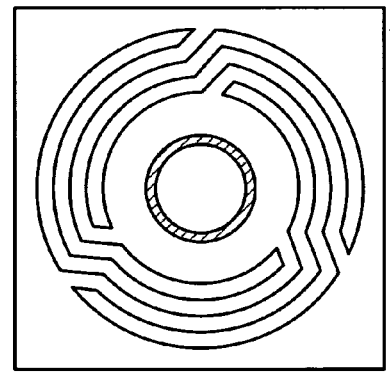
Figure 11A:
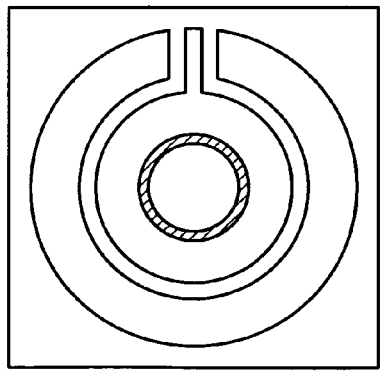
Figure 11D:
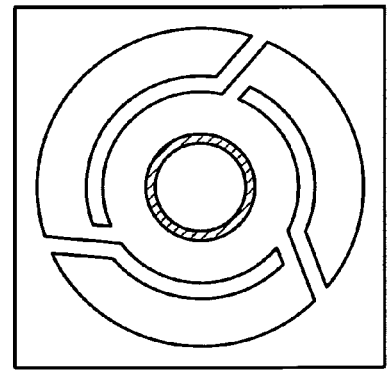

FIG. 11D depicts a "directional" collar/spoke arrangement. Like the FIG. 11C embodiment, the FIG. 11D embodiment breaks the collar into three segments. Each segment connects only at its left end (viewed from outside the collar) to the ground plane. Any capacitive charging current flowing in each spoke/segment can only follow a single direction (clockwise or counterclockwise, depending on whether the ring is being charged or discharged), which may or may not be the same direction as any current induced by the current flowing in the PTH. Accordingly, it is believed that different effects may be achievable by applying either the collar/spoke arrangement of FIG. 11D or its mirror image, e.g., with knowledge of the intended direction of signals traversing a unidirectional signal path.

FIG. 11E is similar to FIG. 11D, but creates longer spoke/collar segments (approximately $\frac{2}{3}^{rd}$ of a turn each instead of $\frac{1}{3}^{rd}$ turn) by stepping each segment midway through its radial length to a second, larger diameter that is clear of the inner ring diameter.

FIG. 11F is similar to FIG. 11E, but contains a single spoke/collar segment that creates two full turns around the PTH.

The principles illustrated in the single-ended collar/spoke arrangements of FIGS. 11A-F can also be adapted to differential PTH collars. For instance, FIG. 12A is adapted from FIG. 11C by mirroring the FIG. 11C collar/segment structure onto the differential peer, such that one set of spokes for each PTH collar faces the peer spokes of the peer PTH collar. In FIG. 12A, the peer spokes and adjoining ring segments are also merged to further encourage differential rather than single-ended coupling of the two PTHs.

Figure 12B:
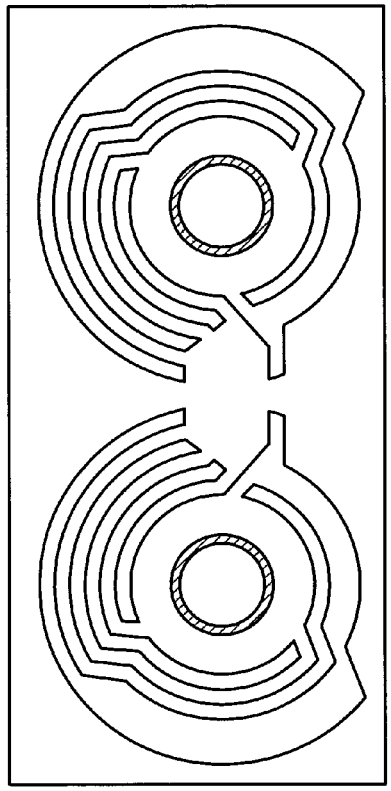
FIGS. 12A-D illustrate, in plan view, exemplary embodiments for differential pair conductor collars.

FIG. 12B is adapted from the collar/spoke arrangements of FIGS. 11D and 11E. Each collar segment extends in the same direction around the PTH until it reaches a large differential spoke situated between the two PTHs. The collar/spoke structure for one PTH is mirrored to the other. This arrangement may be beneficial in a differential pair, as when one PTH is charging its collar the other PTH is discharging its collar.

Figure 12D:
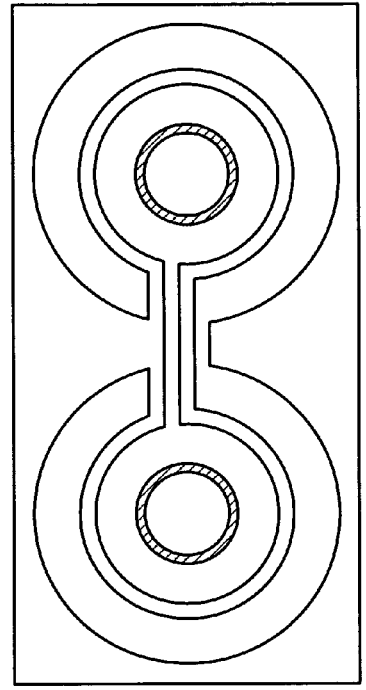
Figure 12A:
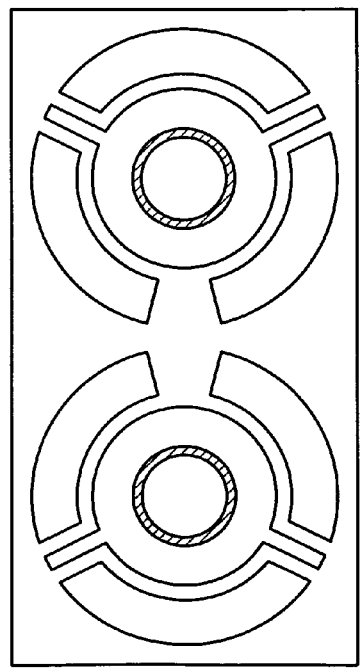
Figure 12C:
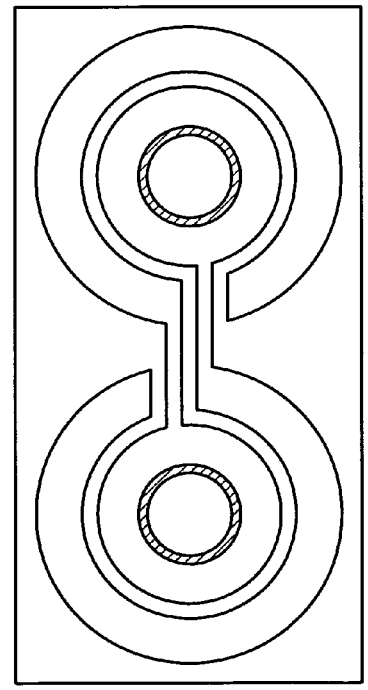

FIG. 12C and FIG. 12D are adapted from FIG. 11A. Instead of both spokes on the looped collar connecting to the ground plane, however, only one spoke connects to the ground plane. The other spoke connects only to one spoke of the other differentially paired collar. In FIG. 12C, the collars are connected to form a single current path that flows in the same direction around both PTHs. In FIG. 12D, the collars are connected to form a single current path that flows clockwise around one PTH and counterclockwise around the other.

Figure 13:
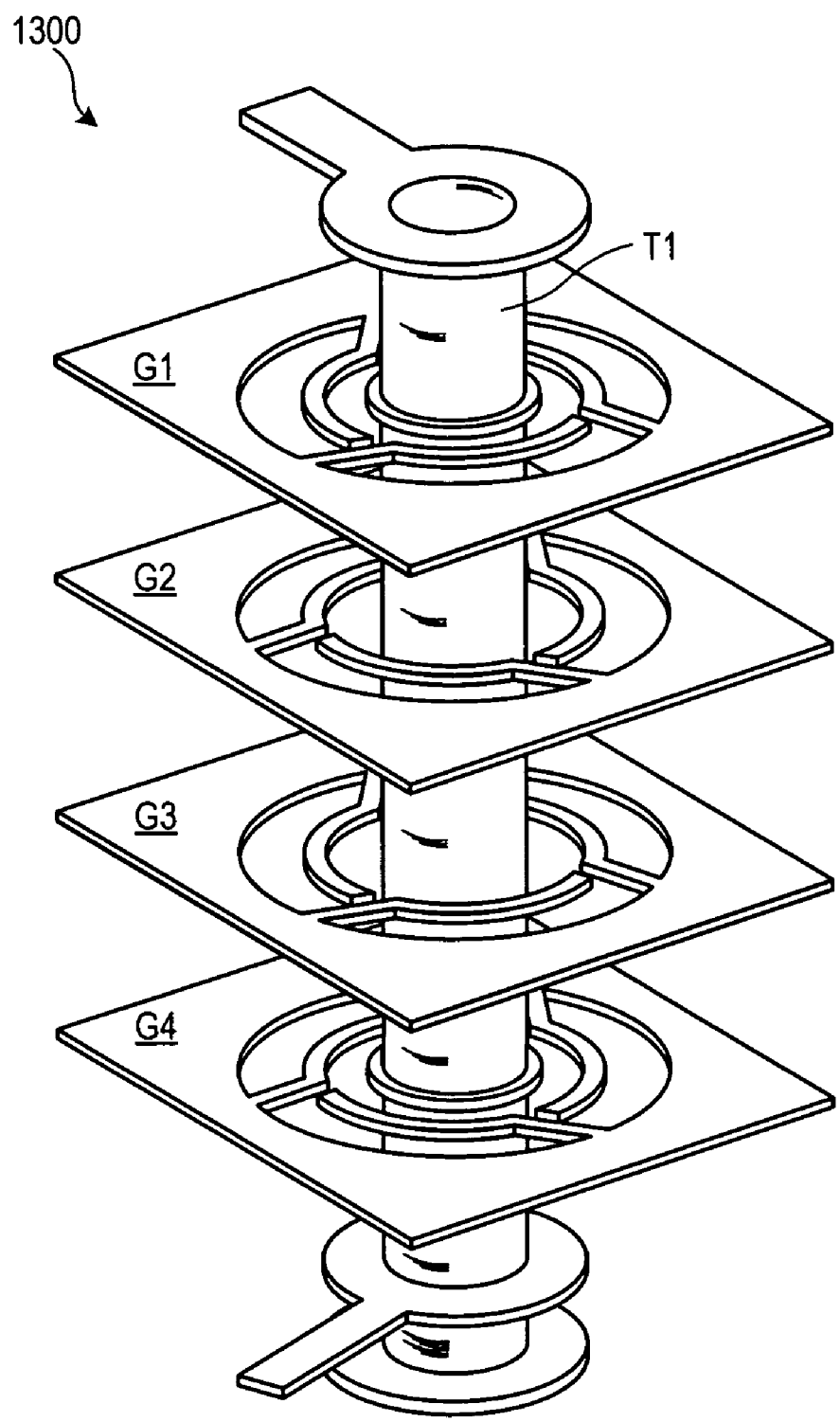
FIG. 13 depicts in perspective view a conductive via passing through four ground plane layers, with directional collars that alternate direction from layer to layer.

FIG. 13 shows in perspective view an exemplary application of the collar/spoke arrangement of FIG. 11D in a multi-ground plane embodiment 1300. A PTH T1 passes through four ground planes G1, G2, G3, and G4. The FIG. 11D directional spoke arrangement and its mirror image are applied alternately between successive ground planes. In the alternative, the directional spoke arrangement can be the same orientation in each ground plane, e.g., to support transmission of signals in one direction and oppose noise transmission in the opposite direction.

Another alternate feature, the use of nonfunctional pads, is depicted in FIG. 13. On ground planes G1 and G4, PTH T1 passes through a nonfunctional pad centered in the clearance. The nonfunctional pads add capacitance to the coupling between the PTH and the collar on the ground planes on which they are deployed, providing another way to customize the PTH impedance.

Figure 14:
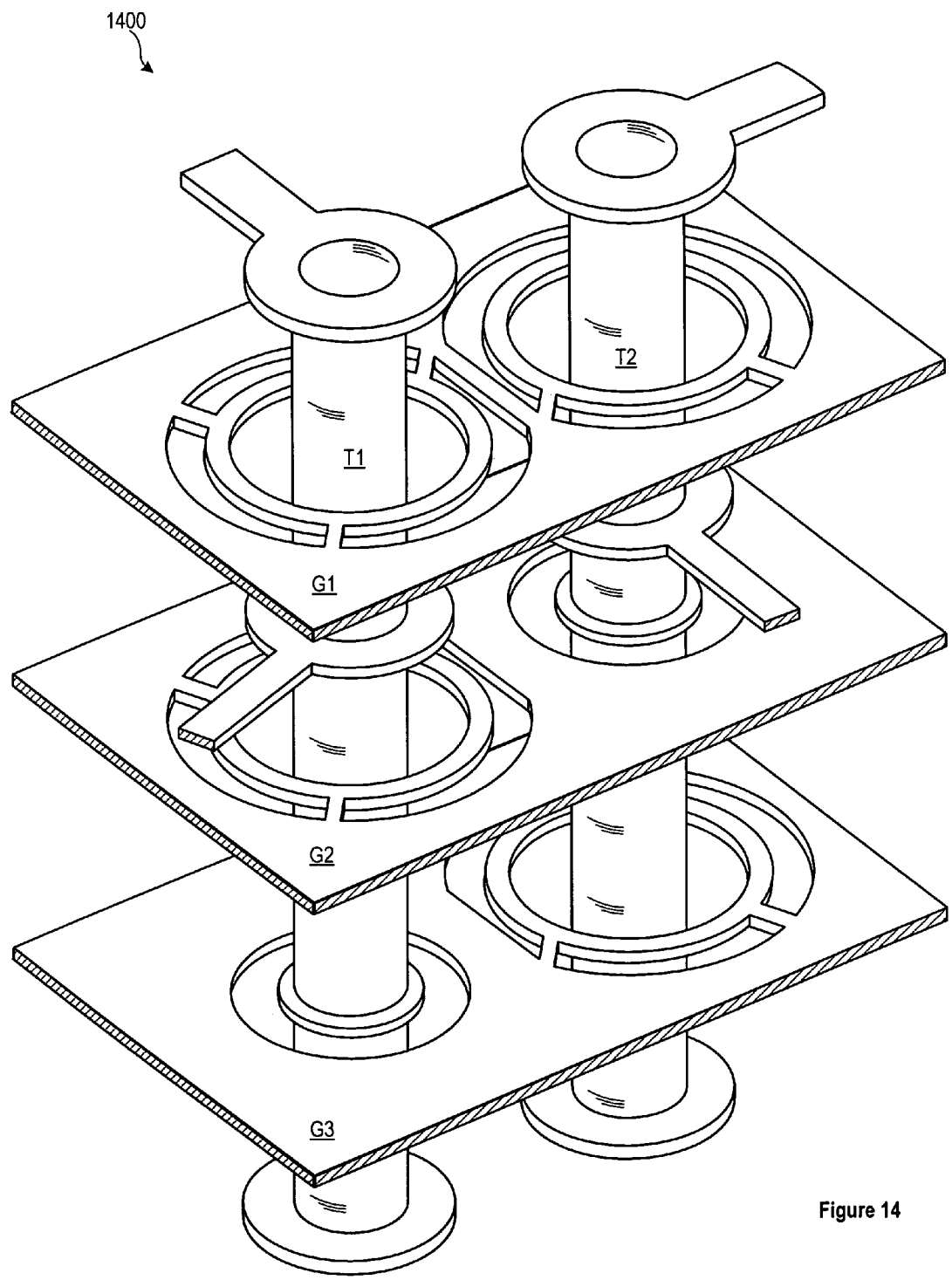
FIG. 14 depicts in perspective view two neighboring conductive vias passing through three ground plane layers, with conductor collars paired with nonfunctional pads on ground plane layers.

FIG. 14 shows in perspective view an exemplary application of the FIG. 4 collar/spoke arrangement for two neighboring PTHs T1 and T2 passing through three ground plane layers G1, G2, and G3. The two PTHs connect signals from a signal layer above G1 to another signal layer positioned between G1 and G2. Accordingly, the portion of each PTH passing through G2 and G3 forms a stub. In the prior art, stub reflections were controlled using nonfunctional pads on each PTH, either on G2, G3, or on both. Because a nonfunctional pad increases the capacitive coupling between a PTH and a ground plane, the crosstalk between two neighboring PTHs is increased on a layer that includes nonfunctional pads. In FIG. 14, reflections are controlled while reducing crosstalk, by pairing a nonfunctional pad on T2 with a collar/spoke arrangement surrounding T1 on G2, and pairing a nonfunctional pad on T1 with a collar/spoke arrangement surrounding T2 on G3. In larger regions of PTHs, these structures can be alternated on a grid to maximize the effect. Also, directional collar/spoke arrangements can be used that favor the propagation of signal/noise towards the end of the PTH stub but resist the return reflection.

Another consideration in the application of collar/spoke arrangements on ground planes is that, if inductance effects come into play and current flow paths are restricted between at least some neighbor PTHs, the ground plane may not be equipotential to the same extent as a similar ground plane without collar/spoke arrangements. To aid in the establishment of a proper ground plane potential, then, in one embodiment it is envisioned that the ground plane—at least in areas with a large number of PTHs—is divided into regions, with each region demarcated from its neighbors by a gridwork of ground PTHs. The ground PTHs provide alternate current paths for the establishment of equipotential between different points in the ground system, thus compensating for the reduction in current paths due to the collar/spoke arrangements. For example, at a frequency of interest, a square gridwork is constructed with each grid approximately one-wavelength square, each grid surrounded by ground PTHs spaced apart by no more than one-quarter wavelength.

Figure 15:
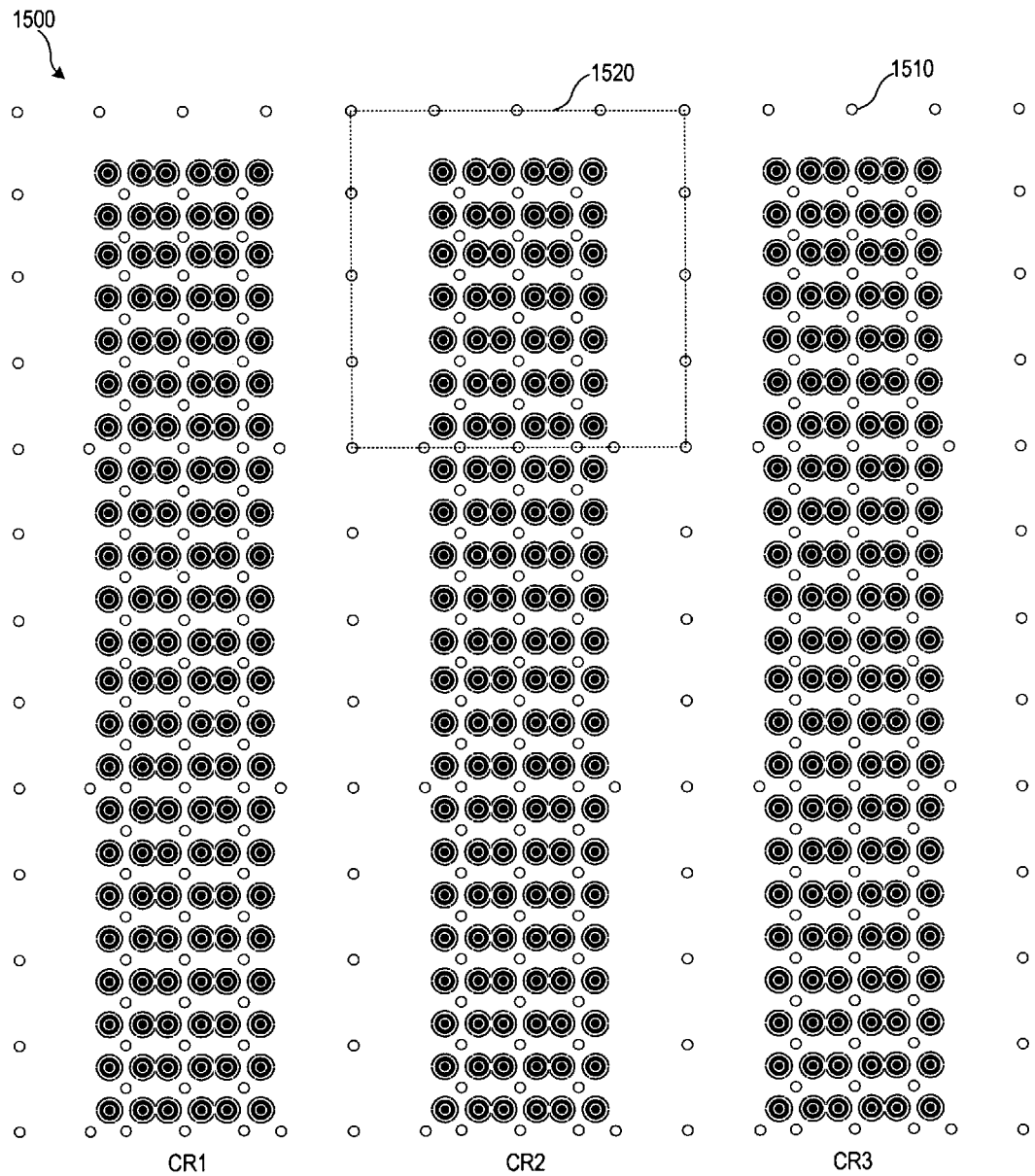
FIG. 15 illustrates in plan view an extended portion of a ground plane layer in multiple adjacent connector regions, including ground plated through holes laid out in a grid to connect the ground plane layer to an adjacent ground plane layer.

Such a structure is illustrated in the ground plane pattern 1500 shown in FIG. 15 in plan view. Three adjacent high-density connector regions CR1, CR2, and CR3 are shown. A gridwork of ground PTHs (ground PTH 1510 is exemplary) is laid out around and through the connector regions, with one such grid highlighted by the boxed hidden line 1520. The ground PTHs assist the ground plane in establishing the proper potential at all points in each plane, and isolating any potential anomalies to one grid.

Those skilled in the art will appreciate that the embodiments and/or various features of the embodiments can be combined in other ways than those described. A small number of exemplary collar/spoke arrangements are shown. The dimensions of these can be varied to achieve a desired effect, or other collar/spoke arrangements can be made using the principles described herein. The applications of different collar/spokes for single-ended and differential PTHs, for the control of reflections and crosstalk at different ground plane levels, etc., can be combined in the same circuit board to enhance performance in a variety of ways. The PTH layouts, number of ground and signal layers portrayed, etc., are merely exemplary, and will vary by application.

Although the specification may refer to "an", "one", "another", or "some" embodiment(s) in several locations, this does not necessarily mean that each such reference is to the same embodiment(s), or that the feature only applies to a single embodiment.

What is claimed is:

1. A circuit board comprising:
  a first conductive via;
  an embedded conductive signal layer having a first signal trace electrically connected to the first conductive via; and
  a first embedded conductive reference plane layer, the first conductive via passing through a first clearance in the reference plane layer, the reference plane layer comprising a first conductive collar adjacent the clearance and capacitively coupled to the conductive via, the collar connected to adjacent portions of the reference plane layer through at least one conductive spoke.

2. The circuit board of claim 1, further comprising:
  a second conductive via neighboring the first conductive via;
  a second signal trace on the embedded conductive signal layer, the second signal trace electrically connected to the second conductive via; and
  a second clearance in the first embedded conductive reference plane layer, the second conductive via passing through the second clearance, the first embedded conductive reference plane layer comprising a second conductive collar adjacent the second clearance and capacitively coupled to the second conductive via, the second collar connected to adjacent portions of the reference plane layer through at least one conductive spoke.

3. The circuit board of claim 2, wherein the first and second signal traces comprise a differential signal pair, and wherein the arrangement of the spokes connecting the first and second conductive collars to adjacent portions of the reference plane layer forms a lower impedance path between the first and second collars than the arrangement of spokes forms to other adjacent portions of the reference plane layer.

4. The circuit board of claim 3, wherein the low impedance path between the first and second collars comprises a wider spoke arrangement located between the first and second collars than elsewhere along the first and second collars.

5. The circuit board of claim 4, wherein each of the collars comprises multiple collar segments.

6. The circuit board of claim 5, wherein one or more of the collar segments, comprising a majority of each collar, connect to adjacent portions of the reference plane layer between the first and second collars.

7. The circuit board of claim 6, wherein all collar segments connect to adjacent portions of the reference plane layer between the first and second collars.

8. The circuit board of claim 5, wherein each collar segment connects to an adjacent portion of the reference plane layer using a single spoke.

9. The circuit board of claim 8, wherein the single spoke of each collar segment in a given collar is located at the same end of each collar segment.

10. The circuit board of claim 9, wherein the single spoke of each collar segment of the other collar is located at the opposite end of each collar segment.

11. The circuit board of claim 4, wherein the first and second conductive collars each comprise a looped trace, the looped trace having two disjoint ends connected respectively to first and second spokes.

12. The circuit board of claim 11, wherein the first spokes of the first and second conductive collars connect the respective conductive collars only to each other.

13. The circuit board of claim 12, wherein the first spoke of the first conductive collar and the second spoke of the second conductive collar connect the respective conductive collars only to each other.

14. The circuit board of claim 1, further comprising a second embedded conductive reference plane layer, the first conductive via passing through a second clearance in the second reference plane layer, the second reference plane layer comprising a second conductive collar adjacent the second clearance and capacitively coupled to the conductive via, the second conductive collar connected to adjacent portions of the reference plane layer through at least one conductive spoke.

15. The circuit board of claim 14, wherein the first and second conductive collars provide a directional collar arrangement, and wherein the first conductive collar has a clockwise directional arrangement and the second conductive collar has a counterclockwise directional arrangement.

16. The circuit board of claim 1, wherein the first conductive collar comprises a directional collar arrangement.

17. The circuit board of claim 16, wherein the directional collar arrangement comprises a looped trace having two disjoint ends connected to adjacent portions of the reference plane layer through first and second spokes, respectively.

18. The circuit board of claim 17, wherein the looped trace doubles back on itself to form at least two loops around the first conductive via.

19. The circuit board of claim 16, wherein the directional collar arrangement comprises a looped trace having two disjoint ends, only one of which connects to adjacent portions of the reference plane layer through the at least one conductive spoke.

20. The circuit board of claim 16, wherein the directional collar arrangement comprises a plurality of collar segments, each connected to adjacent portions of the reference plane layer through a conductive spoke at one end.

21. The circuit board of claim 1, further comprising:
a second conductive via neighboring the first conductive via, the second conductive via not differentially paired with the first conductive via; and
a second clearance in the first embedded conductive reference plane layer, the second conductive via passing through the second clearance, the first embedded conductive reference plane layer comprising a second conductive collar adjacent the second clearance and capacitively coupled to the second conductive via, the second collar connected to adjacent portions of the reference plane layer through at least one conductive spoke, wherein the spokes of the first and second conductive collars comprise a spoke arrangement having no spokes of the first conductive collar substantially aligned with spokes of the second conductive collar in the region of the conductive reference plane layer between the first and second conductive vias.

22. The circuit board of claim 21, further comprising a third conductive via adjacent the first and second conductive vias, the third conductive via connecting the first embedded conductive reference plane layer to a second embedded conductive reference plane layer, at least one spoke of the first conductive collar substantially aligned in the region of the first conductive reference plane layer between the first and third conductive vias, and at least one spoke of the second conductive collar substantially aligned in the region of the first conductive reference plane layer between the second and third conductive vias.

23. The circuit board of claim 1, wherein the at least one conductive spoke comprises a first spoke that crosses a second clearance between the conductive collar and the adjacent portions of the reference plane layer, the first spoke having a longer path from the conductive collar to the adjacent portions of the reference plane layer than the shortest distance between the point the first spoke attaches to the conductive collar and the adjacent portions of the reference plane layer.

24. The circuit board of claim 1, wherein the first conductive via passes through a pad located within the first clearance of the first embedded conductive reference plane layer, the pad having a diameter larger than that of the first conductive via.

25. The circuit board of claim 1, the first conductive via located in a region having a plurality of signal vias with similar conductive collars on the first embedded conductive reference plane layer, the region having a plurality of ground vias spaced around its perimeter.

26. The circuit board of claim 1, further comprising:
a second conductive via neighboring the first conductive via, the second conductive via not differentially paired with the first conductive via;
a second clearance in the first embedded conductive reference plane layer; and
a nonfunctional conductive pad located in the second clearance, the second conductive via passing through the nonfunctional conductive pad.

27. A circuit board comprising:
first, second, and third conductive signal vias, the first and third conductive signal vias adjacent the second conductive via;
a first embedded conductive reference plane layer, the first, second, and third conductive vias passing through first, second, and third clearances in the reference plane layer, the reference plane layer comprising first, second, and third conductive collars respectively adjacent the first, second, and third clearances and capacitively coupled respectively to the first, second, and third conductive vias, the first, second, and third conductive collars inductively coupled to adjacent portions of the reference plane layer such that at frequencies greater than 1 GHz, the impedance between the first and second conductive signal vias, through a path comprising the first and second conductive collars, is less than the impedance between the first and third conductive signal vias, through a path comprising the first and third conductive collars.

28. The circuit board of claim 27, wherein the capacitive coupling between each of the first, second, and third conductive vias and their respective conductive collars is substantially equal.

29. The circuit board of claim 27, wherein the inductive coupling of the first and second collars to each other is substantially less that the inductive coupling of the first collar to the adjacent portions of the reference plane layer.

* * * * *